United States Patent [19]
Termullo, Jr. et al.

[11] Patent Number: 5,631,868
[45] Date of Patent: May 20, 1997

[54] METHOD AND APPARATUS FOR TESTING REDUNDANT WORD AND BIT LINES IN A MEMORY ARRAY

[75] Inventors: Luigi Termullo, Jr., Colchester; Marcel J. Robillard, Williston; James J. Covino, Essex; Stuart J. Hall, Underhill Center, all of Vt.

[73] Assignee: International Business Machines Corporation, Armonk, N.Y.

[21] Appl. No.: 563,831

[22] Filed: Nov. 28, 1995

[51] Int. Cl.⁶ .................. G11C 7/00; G01R 31/28
[52] U.S. Cl. .............. 365/200; 365/201; 371/10.2; 371/22.5
[58] Field of Search .................... 365/200, 201; 371/10.2, 22.5

[56] References Cited

U.S. PATENT DOCUMENTS

| | | | |
|---|---|---|---|
| 4,628,509 | 12/1986 | Kawaguchi | 371/21 |
| 4,660,179 | 4/1987 | Aoyama | 365/200 |
| 4,751,656 | 6/1988 | Conti et al. | 371/10 |
| 4,855,621 | 8/1989 | Hoffmann et al. | 371/20 |
| 4,860,260 | 8/1989 | Saito et al. | 365/201 |
| 5,134,616 | 7/1992 | Barth, Jr. et al. | 371/10.3 |
| 5,195,057 | 3/1993 | Kasa et al. | 365/200 |
| 5,227,999 | 7/1993 | Ihara et al. | 365/200 |
| 5,233,559 | 8/1993 | Brennan, Jr. | 365/200 |
| 5,233,566 | 8/1993 | Imamiya et al. | 365/200 X |
| 5,255,227 | 10/1993 | Haeffele | 365/200 |
| 5,278,839 | 1/1994 | Matsumoto et al. | 371/10.2 |
| 5,289,416 | 2/1994 | Iwai et al. | 365/200 |
| 5,293,386 | 3/1994 | Muhmenthaler et al. | 371/21.1 |
| 5,313,424 | 5/1994 | Adams et al. | 365/200 |
| 5,327,382 | 7/1994 | Seno et al. | 365/210 |
| 5,361,231 | 11/1994 | Hayano | 365/200 |

*Primary Examiner*—Joseph A. Popek
*Attorney, Agent, or Firm*—Whitham, Curtis, Whitham & McGinn; Howard J. Walter, Jr.

[57] ABSTRACT

A method and apparatus for evaluating a memory having memory elements and redundant memory elements for redundancy replacement. The redundant memory elements are tested to determine the number of good redundant memory elements. The memory elements are also tested to determine whether there are any failing memory elements. It is then determined whether a sufficient number of good redundant elements are available to replace the failing memory elements. If an insufficient number of redundant memory elements are available, the testing is stopped.

4 Claims, 4 Drawing Sheets

METHOD AND APPARATUS FOR TESTING REDUNDANT WORD AND BIT LINES IN A MEMORY ARRAY

BACKGROUND OF THE INVENTION

1. Field of the Invention

The present invention generally relates to testing redundant word and bit lines in memory and, more particularly, to a method and apparatus for testing redundant word and bit lines during standard array built-in self-testing (ABIST).

2. Description of the Related Art

It is known to replace failed memory elements or lines in a memory array formed on a chip or substrate by the use of redundant memory elements or lines provided on the chip or substrate. The number of redundant word and bit lines depends on the size of the random access memory (RAM) in question. The larger the RAM, the higher the probability of word and bit lines being defective; therefore, the more advantageous it is to have redundant word and bit lines. Redundancy techniques generally use laser beams to blow fuses formed on the substrate at wafer level. In this manner, redundant elements are used to replace failing elements, thereby improving the yield of the product.

To lower the cost of making memories by reducing testing expenses and improving memory yields, systems have been disclosed which are self-testing and self-repairing. One such system, an array built-in self-test (ABIST) system, is disclosed in U.S. Pat. No. 4,939,694, which uses substitute address tables and error correction code techniques for correcting errors found in a memory cell. Other ABIST systems use one-dimensional and two-dimensional failed address registers to store word addresses of defective cells of a memory array. In other words, redundant lines are provided which extend in either one or two directions parallel to the word lines of the array.

In current designs, ABIST is used to test SRAM (static RAM) macros. Those macros that have redundancy also have a failed address register (FAR) associated with them. The FAR stores the addresses of failing word or bit lines. It also determines if the SRAM is still repairable by keeping track of the number of failing word or bit lines and the number of possible replacements. However, standard ABIST only test the normal word lines in the SRAM prior to fuse blow. During ABIST testing, the fails and failing addresses are loaded into the FAR. These failed addresses are then replaced by redundant word lines at fuse blow, and only after the fuses have been blown and the bad word lines replaced can the redundant word lines be tested by running ABIST once again.

In a young process, the SRAM will be tested at wafer level, the fuses blown to correct the failed word lines, and then retested. However, in a mature process, this is not always the case. The RAM might not be tested once again at wafer test but instead be placed in a module and then tested. If the redundant word lines were bad, then the module would have to be thrown away.

Off-chip testing is usually performed on all stand alone memories. Stand alone chips refer to strictly memory chips; e.g., 1 Megabyte (MB) SRAMs, 4 MB DRAMs (dynamic RAMs), and the like. Stand alone memories are testable with an off-chip tester because all inputs and outputs (I/Os) go off chip and are accessible by a tester. There are disadvantages associated with off chip testing, however. Off-chip testing takes longer to perform, and off-chip testing of very fast memories may be limited by the tester capability. Furthermore, off-chip testing is not possible for embedded memories since such memories do not have their I/Os going off chip and, therefore, cannot be accessed by the tester. An embedded memory is a memory having inputs and outputs coming from and going to logic blocks on the same chip such as a microprocessor. Since there is no access to the I/Os of embedded memories, some type of on-chip testing is required.

In light of the foregoing, there exists a need to allow for on-chip testing of the redundant word (and bit) lines during standard ABIST to determine whether the chip is repairable considering the number of normal word line fails as well as redundant word line fails.

SUMMARY OF THE INVENTION

It is therefor an object of the present invention to provide a method and circuit for testing redundant memory array elements, which substantially obviates one or more of the problems due to the limitations and disadvantages of the related art.

According to the invention, there is provided a method and circuit for testing redundant memory array elements comprising an on-chip memory built-in self-test (BIST) circuit to test redundant memory array elements and store the results of the test. The invention includes circuitry to determine in real time if sufficient "good" redundant memory array elements are available to replace detected failing memory elements prior to a fuse blow. The invention further comprises an address means to sequence the redundant memory addresses, a selection circuit to allow redundant memory location selection, individual fail storage latches for each redundant memory location tested, and a failed address storage register with logic to calculate redundancy replacement excluding redundant locations that failed ABIST testing.

To achieve these and other advantages and in accordance with the purpose of the invention, as embodied and broadly described, the invention provides for a method of evaluating a memory having memory elements and redundant memory elements for redundancy replacement, the method comprising the steps of: (1) testing the redundant memory elements; (2) determining the number of good redundant memory elements and which memory elements are good and which ones are bad; (3) determining whether there are any bad memory lines and which ones are bad; (4) determining whether a sufficient number of good redundant elements are available to replace the failing memory elements; and (5) providing an output to stop testing if an insufficient number of redundant memory elements are available.

In another aspect, the invention provides for a memory test circuit for testing memory elements and redundant memory elements comprising: a means for testing the redundant memory elements; a means for determining the number of good redundant memory elements and which memory elements are good and which ones are bad; means for determining whether there are any bad memory lines and which ones are bad; means for determining whether a sufficient number of good redundant elements are available to replace the failing memory elements; and means for stopping the testing if an insufficient number of redundant memory elements are available.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

The ABIST system and method of the present invention may be utilized to test any type of memory, whether a static random access memory (SRAM) or dynamic random access memory (DRAM). An ABIST can be designed to test either DRAMs or SRAMs; however, the patterns generated by the ABIST to test the different types of memories will probably be different. As a result, it may not be practical to use the same exact ABIST to test a SRAM and a DRAM.

In general, a memory array contains a plurality of horizontally arranged word lines and a plurality of vertically arranged bit lines. A memory cell is located at the intersection of each word and bit line. One or more redundant word or bit lines may be provided in the memory array. It is understood that the word lines, bit lines, and redundant lines include known driver and sense amplifier circuits for writing information into and reading information out of the memory cells.

The memory cells are tested by the ABIST system. Unacceptable or failed cells are identified as to address locations in the array and are replaced by a redundant line. A good memory cell is one capable of carrying out its intended data storage function without error, while a failed or unacceptable memory cell does not function as intended, causing data error.

In a typical example involving a SRAM, the ABIST is used to test the SRAM macros. The macros that have redundancy also have a failed address register (FAR) associated with it. The FAR stores the addresses of failing word or bit lines. The FAR also determines if the SRAM is still repairable by keeping track of the number of failing word or bit lines and the number of possible replacements. A FAR is not required to design an ABIST to test redundant memory locations. The tester that is supplying the clock can be programmed to count the number of cycles and keep track of the address that is being accessed in real time. The tester can then use the failed output to determine if, when and where a fail occurs. Essentially, the failed address register can be part of the tester program; however, this is not the preferred implementation.

In the following description, only redundant word lines are described in the preferred embodiments. However, those skilled in the art will understand that the same teaching applies to redundant bit lines. Moreover, the invention is broadly applicable to testing and replacing memory elements in general.

Figure 1:
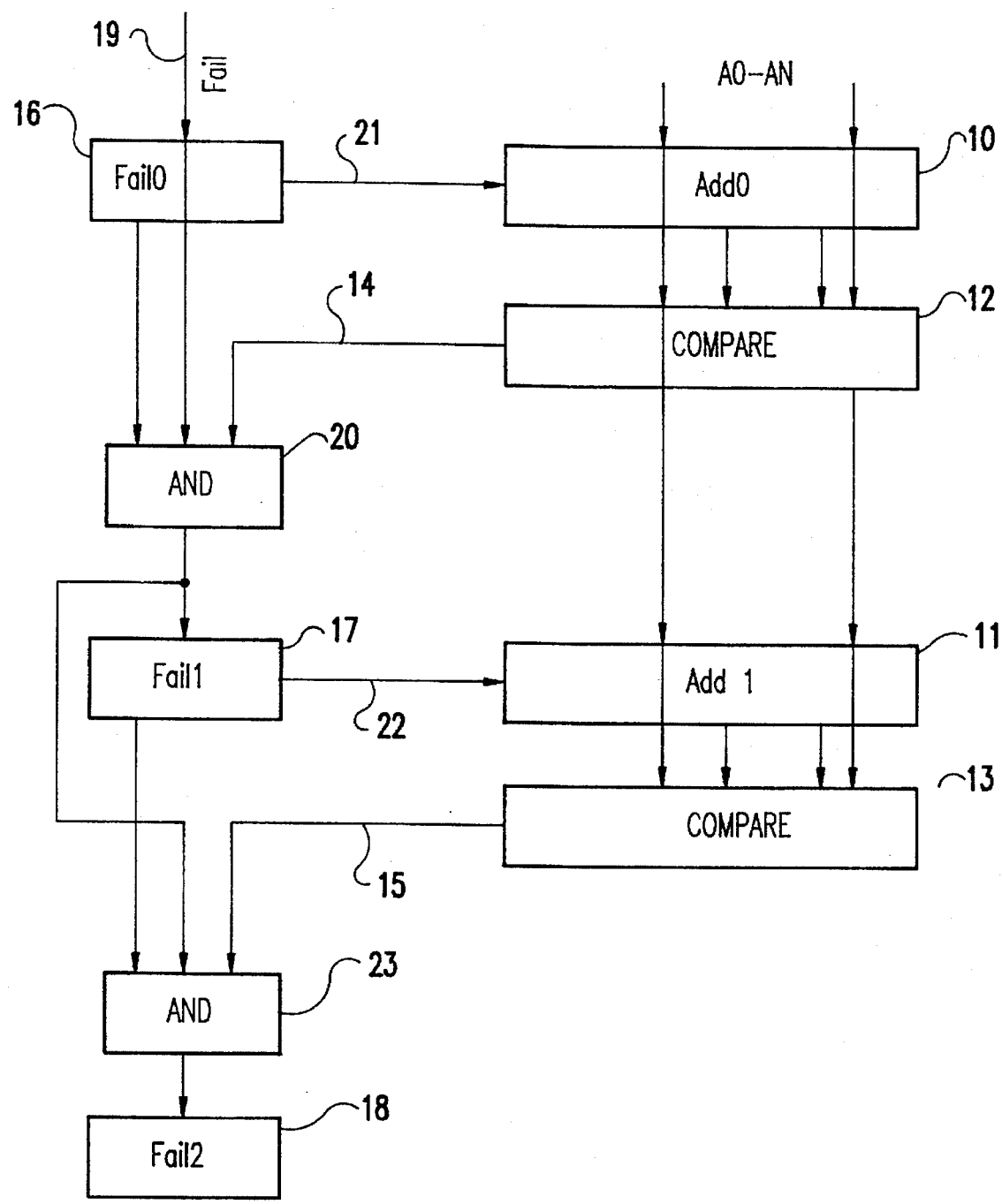
FIG. 1 is a block diagram of a conventional two redundant word line Failed Address Register (FAR)

Referring now to the drawings, and more particularly to FIG. 1, there is shown in block diagram form the basic components of the failed address register (FAR) in a conventional ABIST. In this example, two redundant word lines are assumed. Thus, if up to two failed word lines are detected in the test, it is assumed that the RAM is repairable by blowing the fuses to add one or both the redundant word lines. However, if there are three failures detected, then the RAM is rejected as irreparable.

Address registers 10 and 11 store addresses of failed locations. Initially, these address registers are reset to an empty condition. Incoming addresses AO-AN are supplied to each of the address registers 10 and 11 and to address comparators 12 and 13 which compare the addresses in address registers 10 and 11 with the incoming addresses. If the addresses being compared are the same, the comparator outputs on lines 14 and 15 are "0" (low). Since initially there are no addresses latched in address registers 10 and 11, the addresses temporarily stored in those registers are the incoming addresses. Therefore, the outputs of the comparators 12 and 13 will be "0". However, once an address is latched in an address register, then those incoming addresses which are not identical to the address latched in the address register will result in a "1" (high) output from the corresponding comparator.

Fail hold latches 16, 17 and 18 are used to record the number of fails registered in the conventional ABIST. Fail hold latches 16 and 17 control the latching of addresses in address registers 10 and 11, respectively. Line 19 receives the fail signal from the RAM. Line 19 is connected to the set input of fail hold latch 16 and to one input of AND gate 20. When the first fail signal is received, fail hold latch 16 is set. The first recorded fail stored in fail hold latch 16 causes the address location of that fail to be stored in address register 10 in response to the latch signal on line 21. The latch signal on line 21 coincides with the leading edge of the transition of the fail hold latch 16 to its set state. The output of fail hold latch 16 also enables AND gate 20.

With an address now latched in address register 10, the incoming addresses that are not identical to the latched address will not compare, and the output on line 14 of the comparator 12 will be "1" (high). This output provides a second enabling signal on line 14 to AND gate 20. It will be understood by those skilled in the art that complex test patterns will generate the same address more than once during the ABIST process. Therefore, if the incoming address and the address stored in address register 10 are same, then AND gate 20 should not be enabled. Now, if there is a second fail from the RAM at a different address, the fail signal on line 19 is passed by AND gate 20 to fail hold latch 17, setting that latch. Fail hold latch 17 generates a latch signal on line 22 to address register 11 to store the address location of the second fail. The output of fail hold latch 17 enables a second AND gate 23 which also receives the output of AND gate 20.

With addresses now latched in both address registers 10 and 11, the incoming addresses that are not identical to the latched addresses will not compare, and the outputs of the comparators 12 and 13 will be "1". The output of comparator 13 provides a second enabling signal on line 15 to AND gate 23. Now, if a third fail from the RAM occurs at different addresses than latched in address registers 10 and 11, the fail signal will pass AND gates 20 and 23, setting fail hold latch 18. This fail hold latch provides an output indicating that the RAM is irreparable.

It will be recognized by those skilled in the art that the foregoing description assumes a simple, one-dimensional case. In practice, the RAM array is tested in two dimensions with complex test patterns. Moreover, there may be both redundant bit lines as well as redundant word lines, in which case separate fail hold latches, FARs and related circuitry are required for the second dimension as well. Software, which is part of the ABIST tester, analyzes the stored addresses and makes a final determination as to whether a specific chip repairable or not. However, the description provided is sufficient to illustrate the basic operation of the invention as described below.

Figure 2:
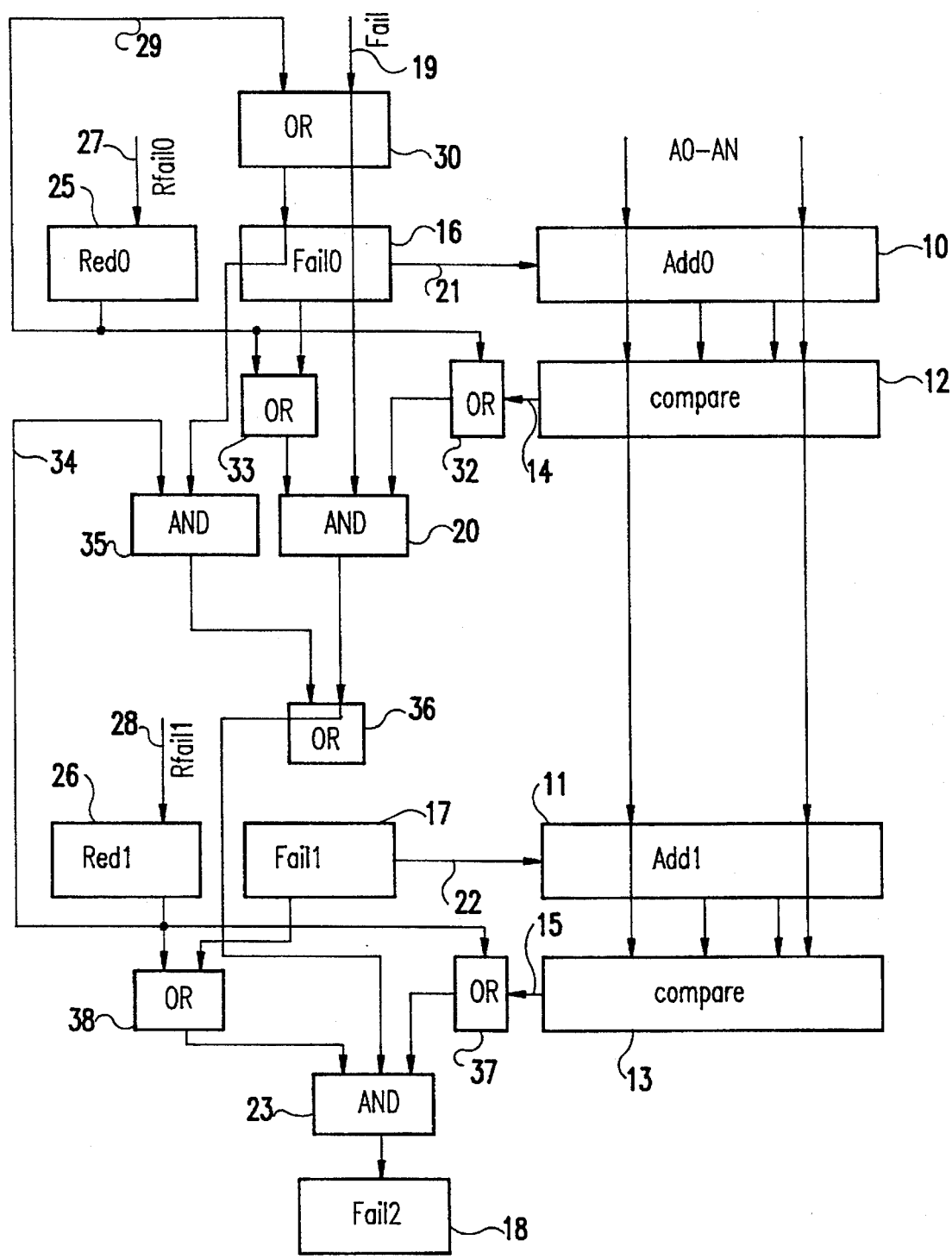
FIG. 2 is a block diagram of a two redundant word line FAR according to a preferred embodiment of the present invention.

FIG. 2 is a block diagram of the FAR incorporating a redundant two word line tester according to the first preferred embodiment of the invention. In FIG. 2, the same reference numerals as used in FIG. 1 denote identical elements. The invention adds redundant location fail hold latches 25 and 26. Lines 27 and 28 are the fail signal lines from the two redundant locations being tested. There is one fail latch and one fail signal for each redundant memory location.

In the practice of this embodiment of the invention, the redundant memory locations are tested first, and fails of redundant location 0 and 1 are stored in fail hold latches 25 and 26, respectively. The fail signals stored in these two latches set up the rest of the logic to bypass the address storage location of the corresponding redundant replacement or allow the fail address register to function normally. If no redundant memory location fails are detected, the operation of the FAR is as described with reference to FIG. 1.

If redundant fail latch 25 stores a fail in it from line 27, the fail signal is then sent along line 29 through OR gate 30 to fail hold latch 16, setting that latch. Line 29 is also sent to OR gate 32 to bypass the compare result from comparator 12 and bypasses the fail result in fail hold latch 16 through OR gate 33. This allows for the next true fail to be stored in fail hold latch 17.

If redundant fail latch 26 stores a fail in it from line 28, the fail signal is then sent along line 34 to AND gate 35. This AND gate receives the output of OR gate 30, setting up a bypass of a true fail to be stored in fail hold latch 17. This bypass is from the output of AND gate 35 to OR gate 36, the output of which is supplied to fail hold latch 17. Line 34 is also sent to OR gate 37 to bypass the compare result from comparator 13 and bypasses the fail result in fail hold latch 17 through OR gate 38. This allows for the next true fail to be stored in fail hold latch 18.

There are several possibilities. First, both redundant word lines pass their tests, in which case both fail hold latches 25 and 26 will remain in their initial or reset states and the FAR will function as in the conventional ABIST described with reference to FIG. 1. Second, if only the first redundant word line fails, fail hold latch 25 will be set, bypassing the fail hold latch 16. This sets up the condition that two true fails in the testing of the RAM will result in setting fail hold latch 18, indicating an irreparable RAM. Third, if only the second redundant word line fails, fail hold latch 26 will be set, bypassing the fail hold latch 17. Again, two true fails in the testing of the RAM will result in setting first fail hold latch 16 and then fail hold latch 18, indicating an irreparable RAM. Fourth, if both the first and second redundant word lines fail, both fail hold latches 25 and 26 will be set bypassing fail hold latches 16 and 17. Under this condition, a single true fail in the testing of the RAM will set fail hold latch 18, indicating an irreparable RAM.

Figure 3:
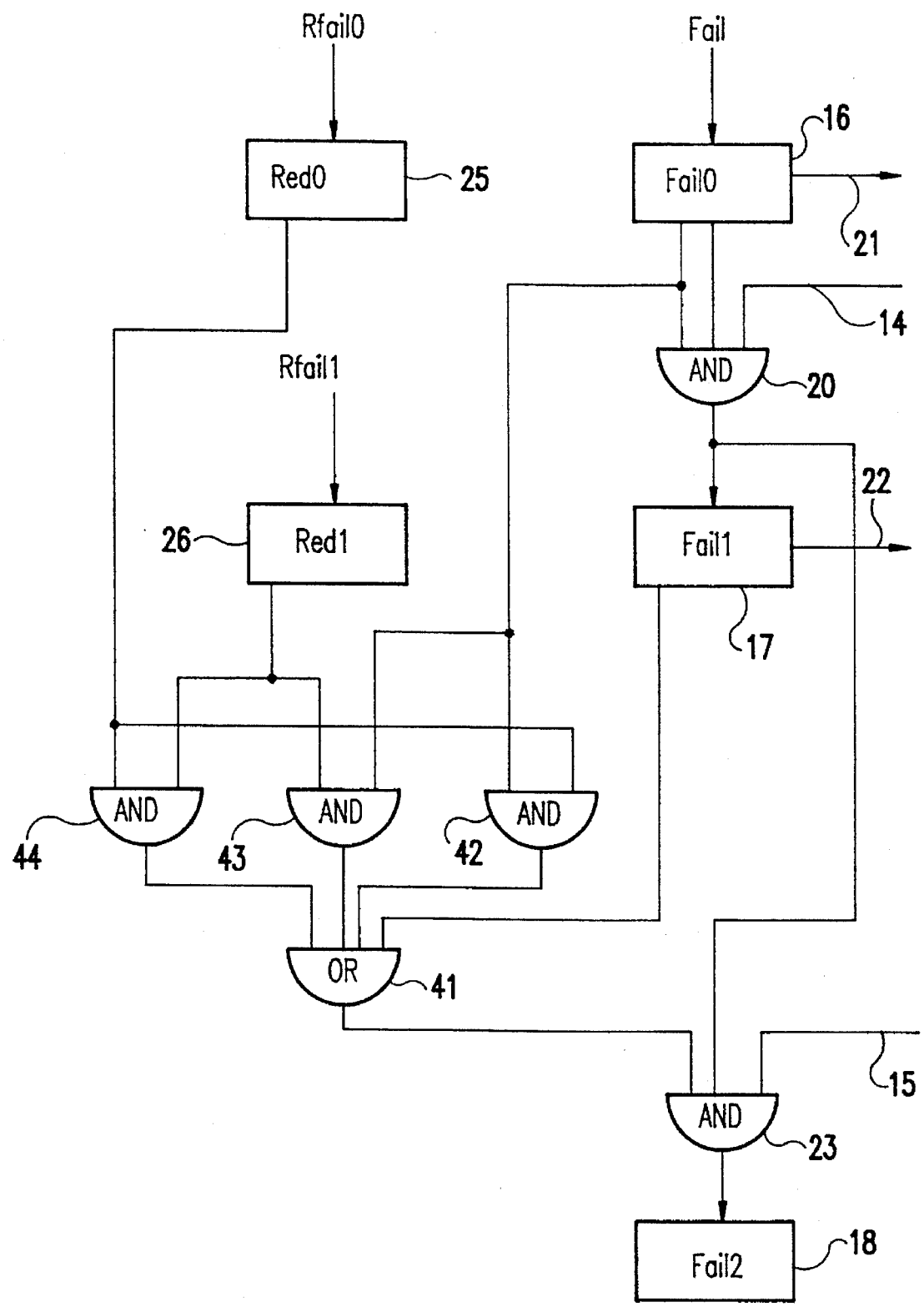
FIG. 3 is a block diagram showing a modification of the preferred embodiment.

It is not necessary to test the redundant word lines first. It is only necessary to test the redundant lines as part of the ABIST procedure. Since any combination of three fails, as indicated by two fail hold latches being set followed by a third fail signal, will signal an irreparable RAM for the example described above, it is only necessary to detect a combination of any two fail hold latches being set to enable the setting of fail hold latch 18 on the occurrence of a third fail. FIG. 3 shows a modification of the circuit shown in FIG. 2 which will detect this condition. Only that part of the circuit which incorporates the modification is shown, and it will be understood that the address registers 10 and 11 and comparators 12 and 13 are included but not illustrated.

In FIG. 3, for the case where fail hold latches 16 and 17 are set, the output of fail hold latch 17 enables AND gate 23 through OR gate 41 so that on the next fail signal, fail hold latch 18 is set as described with respect to FIG. 1. Note here that OR gate 41 performs a similar function to OR gate 38 shown in FIG. 2. If either of the redundant fail hold latches 25 or 26 is set and fail hold latch 16 is set, these conditions are detected by AND gates 42 and 43, respectively. The outputs of these AND gates are supplied to OR gate 41, enabling AND gate 23 to pass the next fail signal to set fail hold latch 18. If both redundant fail hold latches 25 and 26 are set, this condition is detected by AND 44 which also supplies its output to OR gate 41.

Thus, according to the invention, redundant word or bit lines can be tested with all standard ABIST patterns prior to fuse blow with minimal over head to the state machine and FAR. The state machine requires an additional counter to address the redundant address space. For the example of a SRAM with two redundant word lines, a one bit counter will be run to access the redundant word lines.

Figure 4:
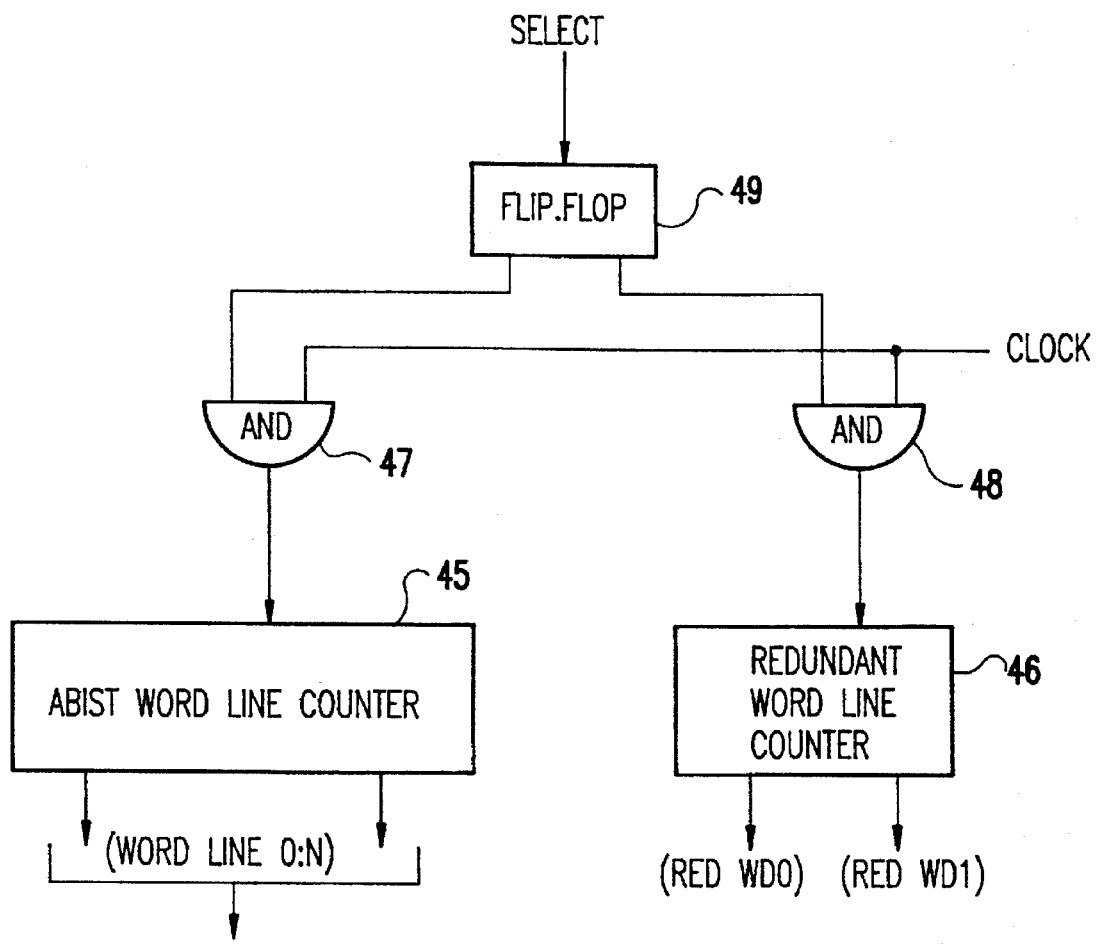
FIG. 4 is a block diagram of an ABIST counter with an added redundancy counter for testing redundant lines first.

FIG. 4 shows a block diagram of the modification of the address counter used in the ABIST to enable redundant word or bit lines to be tested with all the standard ABIST patterns prior to fuse blow. The ABIST counter 45 is augmented by an additional counter, shown as redundant word line counter 46. Clock pulses are supplied to counters 45 and 46 by respective AND gates 47 and 48. A flip-flop 49, toggled by a select signal input, alternately enables AND gates 47 and 48. In the first embodiment, after the redundant word lines have been tested with a test pattern, the counter 45 is triggered to start the standard address space counting. In the second embodiment, the redundant line counter 46 can be triggered at any time during the ABIST test process.

While the invention has been described in terms of the embodiments described above, those skilled in the art will recognize that the invention can be practiced with modification within the spirit and scope of the appended claims.

Having thus described our invention, what we claim as new and desire to secure by Letters Patent is as follows:

1. An array built-in self-testing (ABIST) circuit for memory arrays having redundant memory elements wherein a testing device tests memory elements in a memory array to determine if there are any failing memory elements, the ABIST circuit comprising:

a plurality of fail storage latches equal in number to the number of redundant memory elements, each fail storage latch, when enabled, being set upon detection of a failed memory element;

a plurality of failed address storage registers each responsive to a corresponding fail storage latch for latching an address of a failed memory element upon the corresponding fail storage latch being set during ABIST testing;

a first logic circuit responsive to a latched address in a failed address storage register and enabling a succeeding fail storage latch;

individual redundant fail storage latches for each redundant memory element in the memory array, said testing device additionally testing each of the redundant elements during ABIST testing, the redundant fail storage latches being latched upon detection of a corresponding failed redundant memory element;

a second logic circuit responsive to setting of any one of said redundant fail storage latches for bypassing a corresponding fail storage latch and enabling a succeeding fail storage latch; and a final fail latch enabled by said first and second logic circuits when a combination of redundant element failures and memory array element failures equals a total number of redundant memory elements, said final fail latch, when set, indicating failure of the memory array being tested.

2. The array built-in self-testing (ABIST) circuit for memory arrays recited in claim 1 wherein said first logic circuit comprises:
a plurality of comparators, one for each failed address storage register, each comparator comparing a current address of a memory element being tested with an address currently in a corresponding failed address storage register;
a plurality of AND gates, each AND gate enabled by a corresponding fail storage latch when set and a corresponding comparator when a no compare output is generated, each of said AND gates receiving a fail signal when a failed memory element in the memory array is detected during ABIST testing and passing the fail signal to a next succeeding fail storage latch;

and wherein said second logic circuit comprises:
a plurality of OR gates connected between the comparators and corresponding AND gates and between the fail storage latches and corresponding AND gates and receiving outputs of the redundant fail storage latches so as to bypass a corresponding fail storage latch and enable a succeeding fail storage latch.

3. The array built-in self-testing (ABIST) circuit for memory arrays recited in claim 1 wherein said second logic circuit further comprises an AND gate enabled by a first one of the plurality of fail storage latches and a redundant fail storage latch to bypass a second one of the plurality of fail storage latches when said first one of the plurality of the fail storage latches and redundant fail storage latch are set.

4. The array built-in self-testing (ABIST) circuit for memory arrays recited in claim 1 wherein said first logic circuit comprises:
a plurality of comparators, one for each failed address storage register, each comparator comparing a current address of a memory element being tested with an address currently in a corresponding failed address storage register;
a first plurality of AND gates, each AND gate enabled by a corresponding fail storage latch when set and a corresponding comparator when a no compare output is generated, each of said AND gates receiving a fail signal when a failed memory element in the memory array is detected during ABIST testing and passing the fail signal to a next succeeding fail storage latch;

and wherein said second logic circuit comprises:
a second plurality of AND gates each connected to receive outputs from a predetermined combinations of the redundant fail storage latches and the plurality of fail storage latches; and
an OR gate connected to receive outputs from the second plurality of AND gates and providing an output enabling the final fail latch.

* * * * *